United States Patent
Wu et al.

(12)

(10) Patent No.: US 6,294,449 B1
(45) Date of Patent: Sep. 25, 2001

(54) SELF-ALIGNED CONTACT FOR CLOSELY SPACED TRANSISTORS

(75) Inventors: Teresa J. Wu, Poughkeepsie; Bomy A. Chen; John W. Golz, both of Hopewell Junction, all of NY (US); Charles W. Koburger, III, Essex Junction, VT (US); Paul C. Parries, Wappingers Falls, NY (US); Christopher J. Waskiewicz, Poughkeepsie, NY (US); Jin Jwang Wu, Fairfax, VA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/447,627

(22) Filed: Nov. 23, 1999

(51) Int. Cl.[7] .................................................. H01L 21/44
(52) U.S. Cl. ........................ 438/597; 438/241; 438/586; 438/635; 438/637
(58) Field of Search ..................................... 438/241, 253, 438/396, 586, 597, 621, 635, 637, 652

(56) References Cited

U.S. PATENT DOCUMENTS

| | | | |
|---|---|---|---|
| 5,470,777 | * 11/1995 | Nagata et al. ....................... | 438/241 |
| 5,989,959 | * 11/1999 | Araki .................................. | 438/258 |
| 6,082,828 | * 7/2000 | Lin et al. ............................ | 438/639 |
| 6,146,994 | * 11/2000 | Hwang ................................ | 438/633 |
| 6,162,675 | * 12/2000 | Hwang et al. ....................... | 438/241 |

* cited by examiner

Primary Examiner—Carl Whitehead, Jr.
Assistant Examiner—Jeff Vockrodt
(74) Attorney, Agent, or Firm—Eric W. Petraske

(57) ABSTRACT

A pair of transistors sharing a common electrodes e.g. a bitline in a DRAM array, has a self-aligned contact to the bitline in which the transistor gate stack has only a poly layer with a nitride cover; the aperture for the bitline contact is time-etched to penetrate only between the gates and not reach the silicon substrate; exposed nitride shoulders of the gate are etched to expose the poly; the remainder of the interlayer dielectric is removed by a selective etch; the exposed poly is re-oxidized to protect the gates; and the aperture bottom is cleaned; so that the thick gate stack of a DRAM is dispensed with in order to improve uniformity of line width across the chip beyond what the DRAM technique can deliver.

6 Claims, 4 Drawing Sheets

SELF-ALIGNED CONTACT FOR CLOSELY SPACED TRANSISTORS

FIELD OF THE INVENTION

The field of the invention is integrated circuit processing, in particular, forming self-aligned contacts.

BACKGROUND OF THE INVENTION

In arrays of closely spaced transistors, such as in DRAM memory arrays, it is known to form a self-aligned contact as illustrated in FIG. 1, in which two closely spaced transistors have an aperture formed in the area between them, which is also the location of a bitline buried in the substrate.

Sidewall spacers 35 (preferably oxide) isolate the contact from the two gates. It should be noted that there is a thick nitride cover 50 (illustratively 200 nm thick) over the gate stack that protects the gate during the etching process that forms the aperture for the contact. Unfortunately, this thick layer produces variation in linewidth across the chip that is unacceptable for high performance logic applications. The term high performance logic chips as used here means the transistor generation with very short gate length (on the order of 0.1 um Leff). These short gate length features on a logic chip require extremely precise control of physical dimensions and can tolerate only very small ACLV (across chip linewidth variation) to provide high performance, since the gate length has a direct effect on the current output of the transistor. The use of standard DRAM processing such as a thick nitride cap gate stack does not produce acceptable ACLV. In order to fulfill the ACLV requirement, standard logic process typically uses a simpler and thinner gate stack as seen in FIG. 2. With such a thinner gate stack, the variation on final gate length associated with processing is significantly smaller and able to satisfy the ACLV requirements.

SUMMARY OF THE INVENTION

The invention relates to forming a self-aligned contact that is compatible with high performance logic processing. A feature of the invention is the use of a pair of transistors with standard logic gate stack containing only doped polysilicon 30 (illustratively 100 nm thick) on gate oxide where self-aligned contacts to be formed in the space between the transistor pair. The polysilicon is pre-doped to obtain low resistance for the gate contact. In the conventional DRAM thick gate stack, this low resistance is achieved by building a composite stack with silicide metal over polysilicon.

Once the gates are completed with sidewall spacer 35, followed by the use of a conventional logic process to deposit the etch stop nitride layer 55 and BPSG dielectric layer 60 over the gates, a photo process defines the contact opening in the dielectric which is self-aligned between the transistor pair as depicted in FIG. 2. As in standard processing, a cap nitride liner 55 is used as a first etch stop in the initial partial BPSG dielectric etch removal (FIG. 2). A feature of the present invention is the deliberate removal of that nitride liner in a shoulder region of the gate adjacent to the contact (FIG. 3); followed by removal of the remaining BSPG dielectric film in the contact area (FIG. 4). With nitride liner protecting the contact area at the bottom of the aperture, the exposed polysilicon gate shoulder is then oxidized (FIG. 5). The remaining nitride liner is then removed to open up the contact (FIG. 6).

DESCRIPTION OF THE PREFERRED EMBODIMENT

Figure 2:
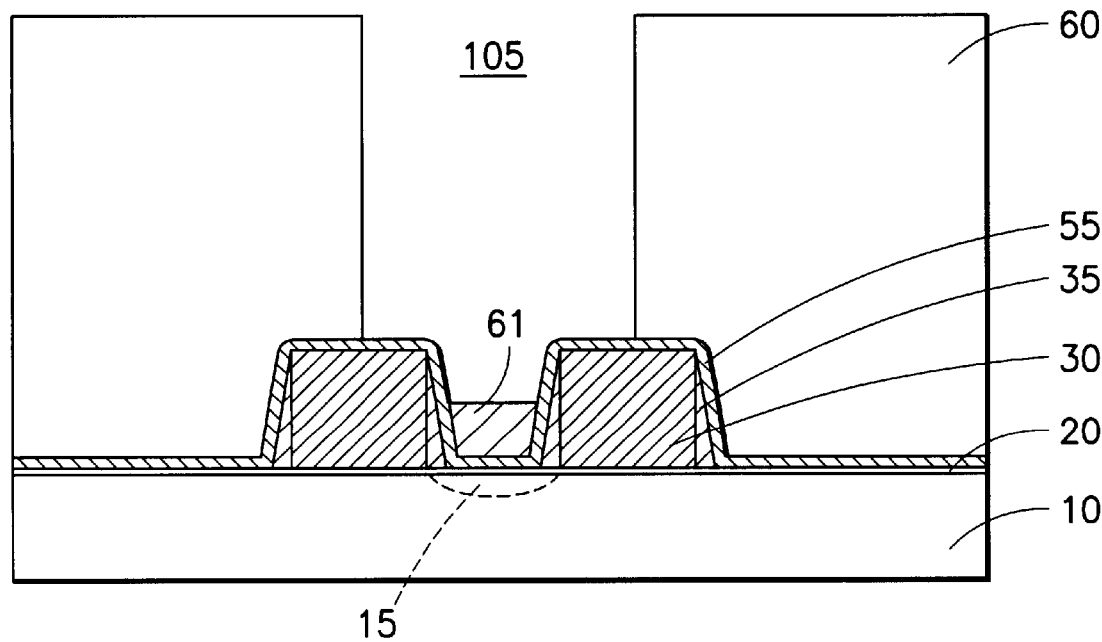
FIGS. 2–7 illustrate steps in the inventive process.

Referring now to FIG. 2, there is shown a pair of transistors separated by a common node 15, also referred to as the contact region. One common example of such an arrangement is a DRAM array in which the transistors share a bitline. SRAM arrays have the same configuration. Another example is that of an inverter in which the transistors are separated by the output node.

Figure 1:
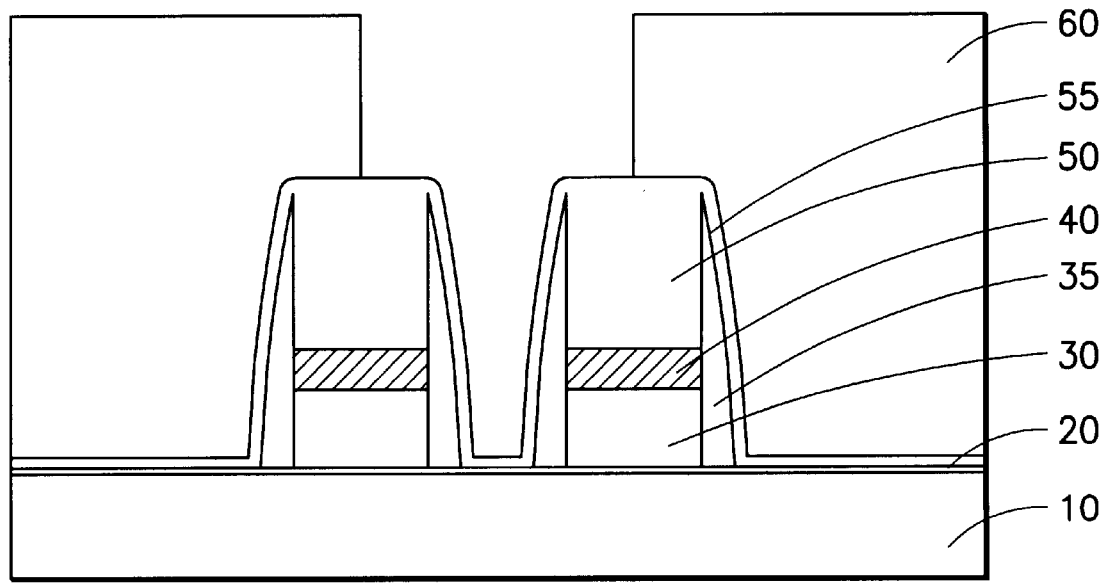
FIG. 1 illustrates a prior-art self-aligned contact.

In the prior art example shown in FIG. 1, the thick nitride etch stop layer 50 protected the transistor gates during the contact etch, but the entire thickness of the nitride cap DRAM gate stack on order of 350 nm results in critical dimension variation typically 70–100 nm across the circuit that may exceed the tight requirements of the logic applications which are on the order of 10–20 nm for ACLV. This is because a thicker and composite film gate stack requires more complicated and longer etching processes that often produce larger variation at the final gate dimension. While this is acceptable for DRAMS, it is not acceptable for logic processing for applications with gate widths requirements of less than about 0.1 $\mu$m for advanced generations of logic chips. On the other hand, a logic gate stack is much thinner and simpler, hence processing these stacks provides the means to obtain acceptable ACLV requirements for logic chips.

According to the invention, the transistors do not use the silicide layer and thick etch stop layer of the prior art. Instead, the poly gate layer is is doped and capped only by the barrier nitride (cap or liner layer) 55 (illustratively 20 nm thick), omitting the silicide and thick nitride layers. FIG. 2 illustrates the result of a partial timed etch through a BPSG dielectric using standard Flourine dry etch chemistry, with the barrier nitride protecting the transistor gate. It will be noted that there is a remaining amount of BPSG 61 at the bottom of the contact aperture, in contrast to the prior art method.

Figure 3:
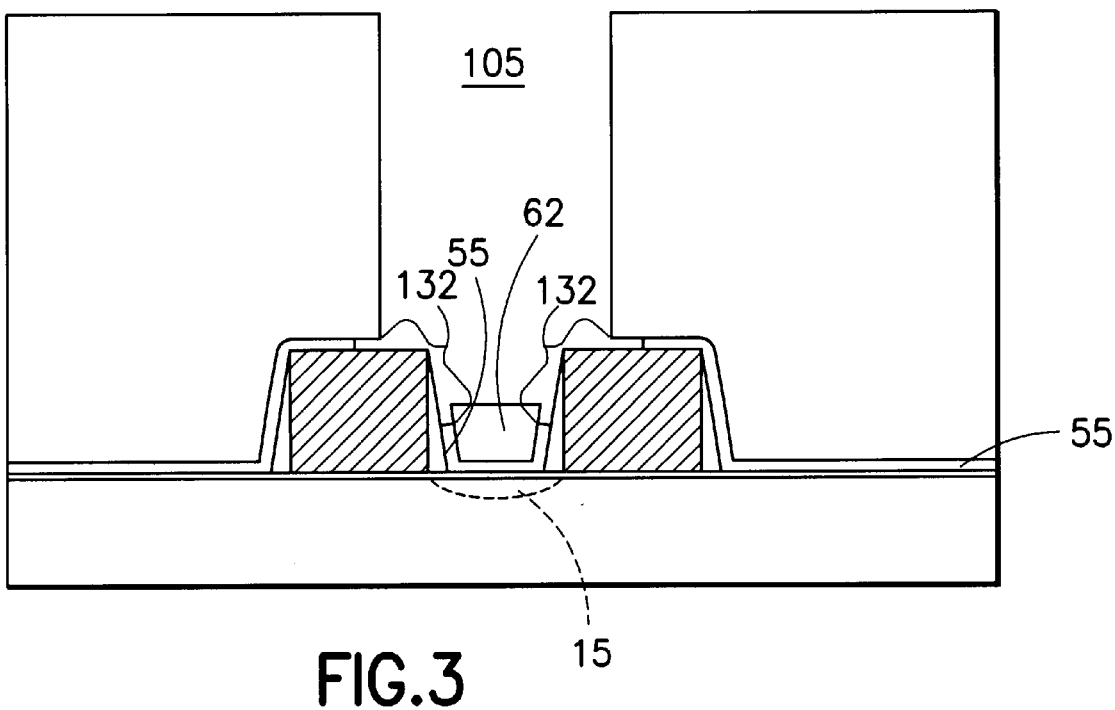

Next, as shown in FIG. 3, the etch is continued with Bromine chemistry that attacks nitride 55, removing it in the areas denoted with brackets 132. The nitride etch process should be selective to the poly film and the sidewall oxide. The cap nitride 55 is etched back along the top of poly gate layer 30 and behind BPSG remainder 62. The conventional oxide sidewall 35 of gate 30 serves to protect the side of the poly gate during this step, but the poly of the gate is exposed on its top surface, so that the chemistry must be chosen such that gate 30 is not attacked. This deliberate removal of the nitride on the shoulder portion of the gate is in contrast to the prior art, in which care is taken to preserve the shoulder portion of the cap nitride layer.

Figure 4:
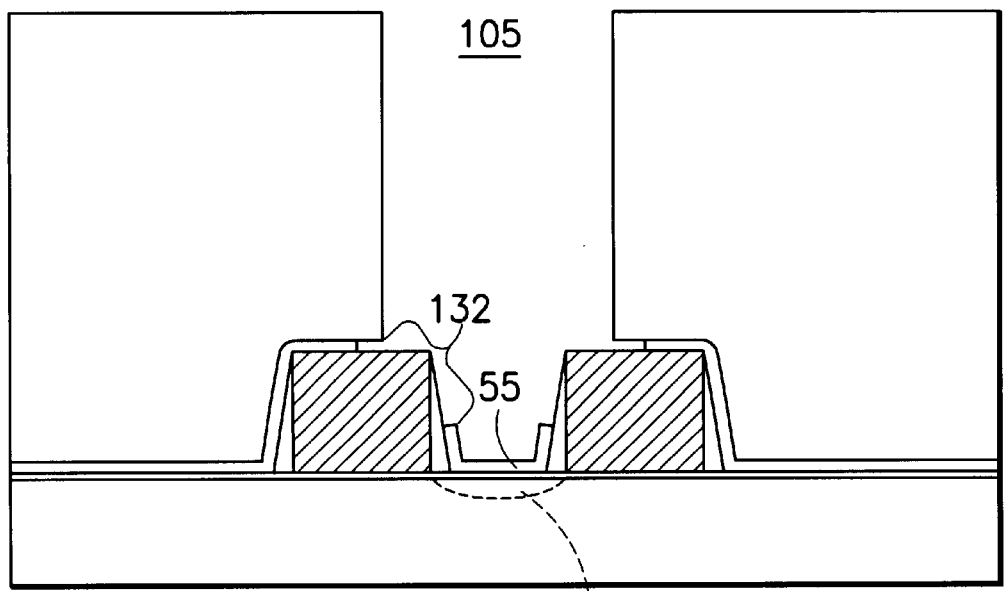

Referring to FIG. 4, BPSG remainder 61 is removed in an etch step using selective Fluorine chemistry that does not attack poly, oxide or the liner nitride at the contact.

Figure 5:
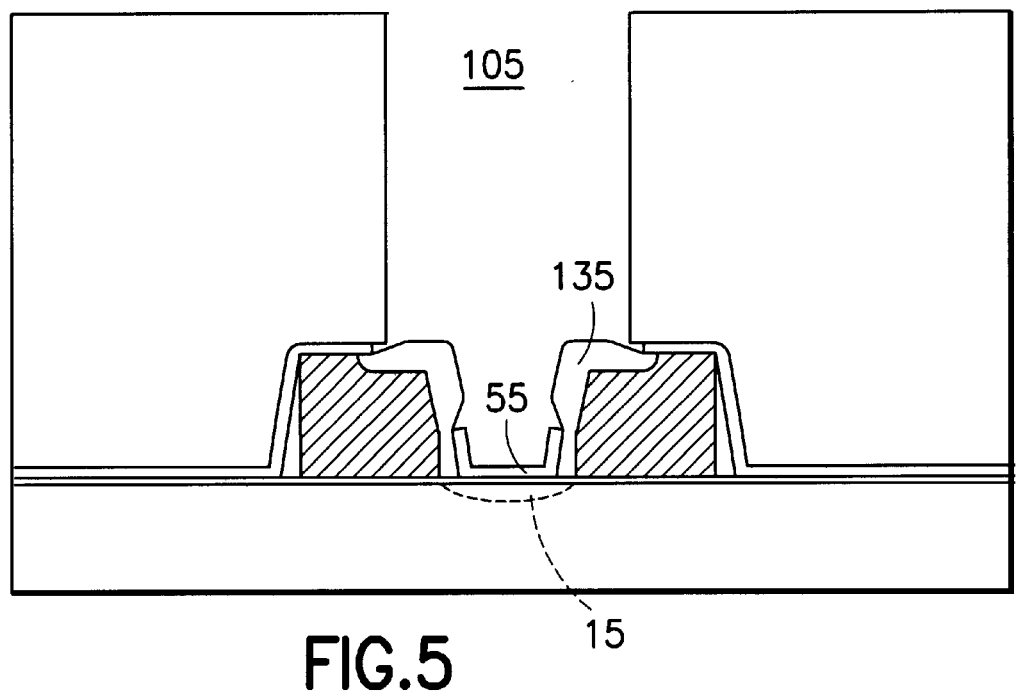
Figure 6:
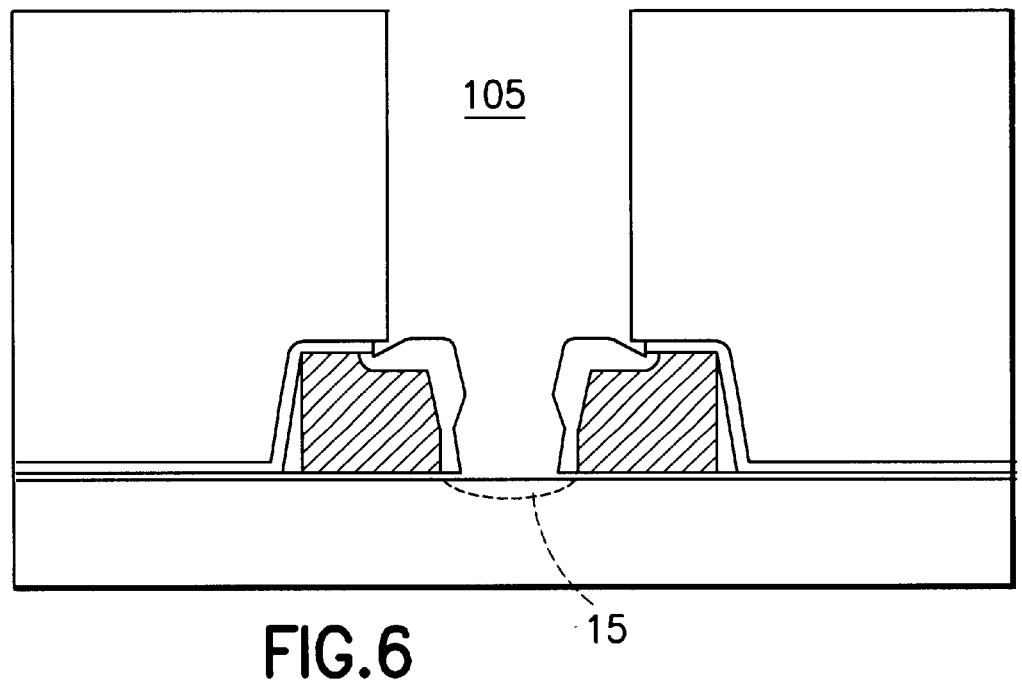

Next, as shown in FIG. 5, a rapid thermal oxide step (illustratively 700° C. for 10 minutes) forms a thin shoulder layer of oxide 135 on the exposed top of poly gate layer 30. A thin layer of only 20 nm is sufficient for the purposes of the invention.

The remainder of cap nitride 55 and gate oxide 20 is removed in a final etch that etches nitride faster than oxide. Since gate oxide is very thin (on order of 5 nm), the sidewall oxide will be preserved. Illustratively, both Fluorine and Bromine chemistry can achieve this goal.

Thus, the same layers have been removed as in the prior art, but instead of a single integrated etch to remove all the BPSG and the liner nitride to open the contact, there is now a first BPSG removal, followed by a nitride strip, a second BPSG removal, and an oxidation followed by the nitride liner opening step.

The benefit of this extra effort is the ability to maintain logic process integration schemes to meet ACLV requirements while allowing the formation of self-aligned contacts which would be necessary for cell size reduction in logic based embedded DRAM applications. After this point, conventional steps are used to fill in the aperture with conductive material and to complete the back end processing. These steps are referred to as "completing the integrated circuit" for purposes of the following claims.

Figure 7:
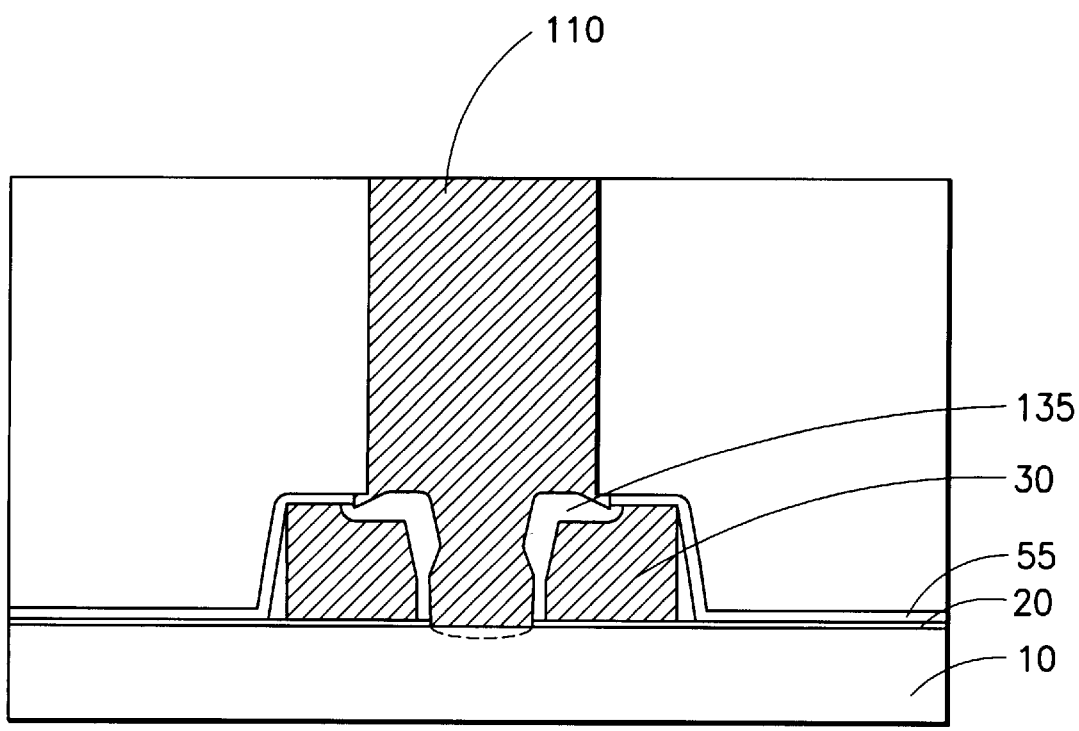

The resulting structure shown in FIG. 7 is that of two CMOS transistors having transistor gates disposed above a substrate and along a transverse axis with a common contact area in said substrate and between said transistor gates, each of said transistor gates having an oxide sidewall adjacent a nitride barrier layer on an outer side thereof and said nitride barrier layer adjacent an outer portion of a top surface thereof, each of said transistor gates having a first oxide sidewall adjacent a lower portion of an inner side thereof and a thermally grown oxide adjacent an upper portion of said inner side thereof and on an inner portion of said top surface thereof, with the contact material 110 filling the space between the two adjacent oxides and extending vertically to connection member.

Contacts that are not closely spaced may also use this process or they can be made with the standard logic process for contact formation which does not involve the nitride liner removal and shoulder oxidation steps. This is simply achieved by a separate masking step. The choice of method will be subject to the usual tradeoffs. If a "non-close" space contact aperture does not expose the cap nitride, then the nitride shoulder strip step will have no effect.

The invention includes the deliberate removal of nitride, oxidation via RTO, or ozone-ambient RTO to allow thicker oxide growth at lower temperature compared with standard RTO. While a thicker oxide provides a more robust contact to gate isolation, it is important to minimize processing temperature during the oxide growth to avoid redistribution of the junction and well dopants. This described invention uses RTO as an example for this new self-aligned contact formation method. Other oxidation methods of polysilicon/silicon using oxygen radicals generated either by heat and or by ozone high pressure deposition process could also be applied. Another alternative is the formation of insulating materials such as $SiO_2$ through surface reaction processes for self-aligned contacts. In summary, any selective oxide growth on exposed polysilicon region via surface reaction mechanism such as by either low temperature oxidation or ozone deposition would applied.

While the invention has been described in terms of a single preferred embodiment, those skilled in the art will recognize that the invention can be practiced in various versions within the spirit and scope of the following claims.

We claim:

1. A method of forming an integrated circuit comprising the steps of:

preparing a substrate;

forming a set of transistors including at least one transistor pair separated by a contact region on said substrate, said transistors containing a gate, source sidewalls, drain sidewalls and a cap layer;

depositing a dielectric layer over said transistors;

etching a contact aperture through said dielectric layer between said pair of transistors, stopping on said cap layer, whereby a remainder portion of said dielectric layer and of said cap layer remains in said aperture and a shoulder portion of said cap layer is exposed on facing shoulders of said transistor pair;

removing said exposed shoulder portion of said cap layer, thereby exposing a shoulder portion of said gate;

removing said remainder portion of said dielectric;

oxidizing said shoulder portion of said gate;

removing said remainder portion of said cap layer and a corresponding amount of gate oxide beneath said remainder portion of said cap layer, thereby exposing said substrate in said contact region;

forming a contact in said contact aperture; and completing said integrated circuit.

2. A method according to claim 1, in which said step of oxidizing said shoulder portion of said gate is carried out by Rapid Thermal Oxidation.

3. A method according to claim 1, in which said step of oxidizing said shoulder portion of said gate is carried out by ozone deposition.

4. A method according to claim 1, in which said gate comprises polycrystalline silicon less than about 100 nm thick.

5. A method according to claim 4, in which said cap layer is in direct contact with a gate top surface of said polycrystalline silicon gate.

6. A method according to claim 5, in which said cap layer is formed from nitride.

\* \* \* \* \*